United States Patent
Katabe et al.

(10) Patent No.: US 8,449,973 B2
(45) Date of Patent: May 28, 2013

(54) REFLECTIVE MEMBER, LIGHT-EMITTING DEVICE USING SAME AND ILLUMINATING DEVICE

(75) Inventors: Kousuke Katabe, Higashiomi (JP); Yuki Mori, Higashiomi (JP)

(73) Assignee: Kyocera Corporation, Kyoto (JP)

( * ) Notice: Subject to any disclaimer, the term of this patent is extended or adjusted under 35 U.S.C. 154(b) by 1091 days.

(21) Appl. No.: 11/909,147

(22) PCT Filed: Mar. 25, 2006

(86) PCT No.: PCT/JP2006/306041
§ 371 (c)(1),
(2), (4) Date: Dec. 8, 2008

(87) PCT Pub. No.: WO2006/104061
PCT Pub. Date: Oct. 5, 2006

(65) Prior Publication Data
US 2009/0213591 A1    Aug. 27, 2009

(30) Foreign Application Priority Data

Mar. 29, 2005  (JP) ................................. 2005-095015
Nov. 30, 2005  (JP) ................................. 2005-346904

(51) Int. Cl.
*B32B 3/26*  (2006.01)

(52) U.S. Cl.
USPC .................. 428/307.3; 428/304.4; 428/306.6; 428/689; 428/697; 428/702

(58) Field of Classification Search
USPC ................ 428/304.4, 306.6, 307.3, 434, 688, 428/689, 697, 702
See application file for complete search history.

(56) References Cited

U.S. PATENT DOCUMENTS

| 4,802,186 | A | 1/1989 | Gibson et al. |
| 4,912,720 | A | 3/1990 | Springsteen ..................... 372/72 |
| 5,851,649 | A * | 12/1998 | Mohri et al. ............... 428/319.1 |
| 6,914,719 | B2 | 7/2005 | Koyama et al. |
| 2004/0116033 | A1 | 6/2004 | Ouderkirk et al. |
| 2004/0228146 | A1 | 11/2004 | Koyama et al. |
| 2005/0191464 | A1 | 9/2005 | Takahashi et al. |

FOREIGN PATENT DOCUMENTS

| EP | 0778250 A1 | 6/1997 |
| EP | 1424571 A1 | 6/2004 |
| JP | 11-029745 | 2/1999 |
| JP | 11213892 A | 8/1999 |
| JP | 2001229838 A | 8/2001 |
| JP | 2003086475 A | 3/2003 |
| JP | 2004-207678 | 7/2004 |
| WO | 2004013664 A1 | 2/2004 |

OTHER PUBLICATIONS

Korean language office action and its English language translation for corresponding Korean application No. 2007-7023551 Office Action dated Mar. 10, 2010.

(Continued)

*Primary Examiner* — Jennifer McNeil
*Assistant Examiner* — Lauren Colgan
(74) *Attorney, Agent, or Firm* — DLA Piper LLP (US)

(57) ABSTRACT

The present invention relates to a reflective member. The reflective member includes a reflective layer formed to be porous using an inorganic material. The reflective layer has a porosity of 15-43%. The reflective layer is formed by partly combining a plurality of inorganic particles with each other.

4 Claims, 10 Drawing Sheets

OTHER PUBLICATIONS

Japanese language office action dated Apr. 12, 2011 and its English language translation for corresponding Japanese application 2007510464.

Wu Jianfeng et al., "Preparation of Laser Cavity of Alumina Ceramics" Department of Materials Science & Engineering, Wuhan University of Technology, Wuhan 430070, pp. 25-27 (with partial English translation), (vol. 5, 2003).

Chinese language office action and its English language translation for corresponding Chinese application 2006800176426, May 2009.

Korean language office action and its English language translation for corresponding Korean application 20077023551, Apr. 2011.

European search report for corresponding European application 06729989.1, Jul. 2010.

European Patent Office office action dated Oct. 4, 2011 for corresponding European Patent Application No. 06729989.1.

Chinese language office action dated Nov. 16, 2011 and its English language translation for corresponding Chinese application 200680017642.6.

European office action dated Oct. 16, 2012 issued in corresponding European application 06729989.1.

* cited by examiner

REFLECTIVE MEMBER, LIGHT-EMITTING DEVICE USING SAME AND ILLUMINATING DEVICE

TECHNICAL FIELD

The present invention relates to a reflective member for efficiently reflecting, in a desired direction, electromagnetic wave emitted by an electromagnetic wave generating element. The present invention further relates to a light-emitting device and an illuminating device using the reflective member.

BACKGROUND ART

An example of a conventional reflective member is shown in FIG. 14. The illustrated reflective member 90 is used as a reflective plate for an illuminating device, for example, and includes a metal base 91 having a surface formed with a reflective film 92. The reflective film 92 includes a transparent-resin base material 93 in which particles 94 made of e.g. aero silica gel are dispersed. A difference in refractive index of the base material 93 and the particles 94 is utilized to increase the reflectance (see Patent Document 1, for example).

Since the reflective member 90 utilizes total reflectance due to the difference in refractive index, the reflectance is very high in a band of wavelength where no light is absorbed by the resin material contained in the base material 93. Thus, light efficiency is enhanced in e.g. fluorescent lamp for general lighting. On the other hand, in the reflective member 90, since the base material 93 contains resin, when the base material 93 is irradiated with light in a band of wavelength which is absorbed by the resin, the base material 93 is disadvantageously deteriorated and colored.

The reflective member may be a reflective material "Spectralon" (registered mark) made by compacting resin powder (see Patent Document 2, for example). Such a reflective material has a high workability and is used as a reflectance standard or an integrating sphere. However, since the reflective member also contains resin, when being irradiated with light in a band of wavelength which is absorbed by the resin, the reflective member is disadvantageously deteriorated and colored.

As described above, if a resin is used as a main component of a member for reflection, when the member is irradiated with a light in a band of wavelength which is absorbed by the resin, the resin is deteriorated and colored. As a result, in a reflective member containing a resin, reflectance is disadvantageously reduced due to deterioration of the resin.

Further, in a display device or an illuminating device, heat generated at a lighting circuit further deteriorates and colors the resin, and thus encourages reduction in reflectance. Therefore, it is unfavorable to use a resin for making a reflective member of a device in which a light source frequently emits light, such as a display device and an illuminating device. Especially, in a device using a light source such as an LED and an LD for emitting light of short wavelength (ultraviolet light, near ultraviolet light, or blue light), since the energy of light emitted by the light source is large, deterioration of the reflective member due to light absorption by the resin, or reduction in reflectance, is likely to occur.

The reflective member may also use ceramics made by sintered inorganic particles (see Patent Document 3, for example). Inorganic materials have binding energy generally larger than that of organic materials, and thus have enhanced light resistance and heat resistance. Thus, the reflective member using ceramics is advantageous in that it is less deteriorated due to light absorption, in comparison with the reflective member using a resin which is an organic material.

Patent Document 1: JP-A-11-29745
Patent Document 2: U.S. Pat. No. 4,912,720
Patent Document 3: JP-A-2004-207678

DISCLOSURE OF THE INVENTION

As shown in FIG. 15, the reflective member 95 made of ceramics includes a ceramics portion 96 for reflection, in which inorganic particles are baked to be combined with each other. With such structure, there is very little air gaps 97, and thus the porosity is about 0-1%. Thus, in the reflective member 95, most of the incident light is efficiently reflected by a surface 98, while part of the incident light enters into the reflective member 95. Such entering light is shut within the ceramics portion 96, and finally absorbed by the ceramics portion 96. Therefore, in the reflective member 95, since the entering light is not reflected, the light energy is attenuated and results in light loss. As a result, the reflection efficiency is relatively low.

An object of the present invention is to provide a reflective member, for efficiently reflecting wave components such as light, and for reducing deterioration in reflection property. The present invention further relates to a light-emitting device and an illuminating device using the reflective member.

According to a first aspect of the present invention, there is provided a reflective member comprising a reflective layer formed to be porous using an inorganic material.

The reflective layer has a porosity of 15-43%. The reflective layer is formed to be porous, by partly combining a plurality of inorganic particles with each other by calcination, for example, so that air gaps are formed between the inorganic particles. The air gaps are filled with a gas or a transparent material having a refractive index lower than that of the inorganic particles.

The reflective member may include only the reflective layer, but may also include a base on which the reflective layer is formed.

The inorganic particles contain at least one of alumina, yttria, zirconia, and titania.

According to a second aspect of the present invention, there is provided a method of manufacturing reflective member including a reflective layer formed to be porous using an inorganic material, comprising the steps of forming an inorganic layer or an inorganic-particle compact containing a plurality of inorganic particles and calcining the inorganic layer or the inorganic-particle compact to be porous.

According to a third aspect of the present invention, there is provided a method of manufacturing reflective member including a reflective layer formed to be porous using an inorganic material, comprising the step of spraying a coating material, containing a plurality of inorganic particles and a binder, on a surface of a base material, for forming a porous layer on the surface of the base material.

The manufacturing method further comprises the step of heating for combining the inorganic particles in the porous layer and removing the binder therefrom.

According to a fourth aspect of the present invention, there is provided a light-emitting device comprising at least one light-emitting element and a reflective member for reflecting light emitted by the light-emitting device, the reflective member including a reflective layer made to be porous using an inorganic material.

The reflective member has a reflectance of not less than 95% with respect to a peak wavelength of the light-emitting element.

The light-emitting element is an LED chip or an LD chip. The light-emitting element emits ultraviolet light, near ultraviolet light, or blue light.

According to a fifth aspect of the present invention, there is provided an illuminating device comprising at least one light-emitting device according to the fourth aspect of the present invention.

Examples of the illuminating device according to the present invention include devices used indoors or outdoors, such as a common lighting equipment; a lighting equipment for chandelier, house, office, shop, exhibition, street, guidance and signal, and stage and studio; advertising lamp; lighting pole; underwater lighting; strobe light; spotlight; security lighting incorporated in e.g. electric pole; emergency lighting; flashlight; electronic signboard; dimmer; flasher; backlight for e.g. image display; video player; ornament; illuminated switch; light sensor; medical lighting; and in-vehicle lighting.

The present reflective member includes the reflective layer which is a porous body made by partly combining a plurality of inorganic particles with each other to form air gaps between the inorganic particles. With such structure, a wave component such as light is reflected at the surface of the reflective member, and even the wave component entering into the reflective member (reflective layer) is totally reflected at the boundary surface between an inner surface of a hole and the air gap. Specifically, since the air gap is filled with a gas such as air or a transparent material having a refractive index lower than that of the inorganic particles, a difference exists in the refractive index of the inner surface of the hole and the filler. Thus, the incident wave component is totally reflected at the boundary surface (reflective surface). Further, since the reflective layer is a porous body with a suitable porosity, adequate air gaps (holes) are formed in the reflective layer, which provide adequate reflective surfaces in the reflective member. In this way, in the present reflective member, the wave component entering into the reflective member is efficiently reflected. As a result, the wave component such as light is efficiently prevented from being shut in the reflective member, so that significantly high reflection efficiency is obtained.

The present reflective layer of the reflective member, which is made of an inorganic material, has light resistance and heat resistance higher than those of a reflective layer of a reflective member mainly containing an organic material. Therefore, the present reflective member reliably prevents deterioration of reflectance efficiency due to material degradation.

Further, by forming the reflective layer by combining the inorganic particles with each other, the reflective member (reflective layer) has a sufficient strength to prevent peeling off of the inorganic particles.

Still further, by setting the porosity of the reflective layer to 15-43%, the air gaps (holes) of the reflective layer (reflective member) are prevented from being formed too much. Thus, the reflective layer (reflective member) has sufficient strength, and the area of the boundary surfaces (reflective surfaces) between the inner surfaces of the holes and the air gaps is prevented from being unduly small. As a result, the present reflective member has a high strength and reflectance efficiency.

According to the present manufacturing method, the reflective layer (reflective member) is made to have an adequate air gaps (holes) and a high reflectance, as well as a sufficient strength with partly combined inorganic particles.

The light-emitting device and the illuminating device according to the present invention include the above-described reflective member, and thus are capable of reflecting light emitted by a light-emitting element, in a desired direction with high efficiency. Therefore, the present light-emitting device and the illuminating device may have a very high light intensity, and also are capable of stably keeping the light intensity for a long period.

Further, since the light-emitting device is made of an inorganic material to have a high light resistance, even when using a light-emitting element such as an LED chip or an LD chip emitting light with high energy, such as ultraviolet light, near ultraviolet light, and blue light, the reflective member is prevented from deterioration, and thus stable output is maintained for a long period.

BRIEF DESCRIPTION OF THE DRAWINGS

FIG. 9 shows graphs indicating measurement results of porosity and reflectance in Example 2.

FIG. 10 shows SEM photographs of a reflective member according to Example 3 of the present invention.

FIG. 11 shows SEM photographs of a comparative sample of the reflective member in Example 3.

| | LEGEND |
|---|---|
| 1 | illuminating device |
| 2 | light-emitting device |
| 4 | light-emitting element (of the light-emitting device) |

-continued

| LEGEND | |
|---|---|
| 6 | first reflective member |
| 61 | reflective layer (of the first reflective member) |
| 64 | holes (in the first reflective member) |
| 7 | second reflective member |
| 70 | holes (in the second reflective member) |

BEST MODE FOR CARRYING OUT THE INVENTION

An illuminating device, a light-emitting device, and reflective members according to the present invention will be described below with reference to FIGS. 1-4.

Figure 1:
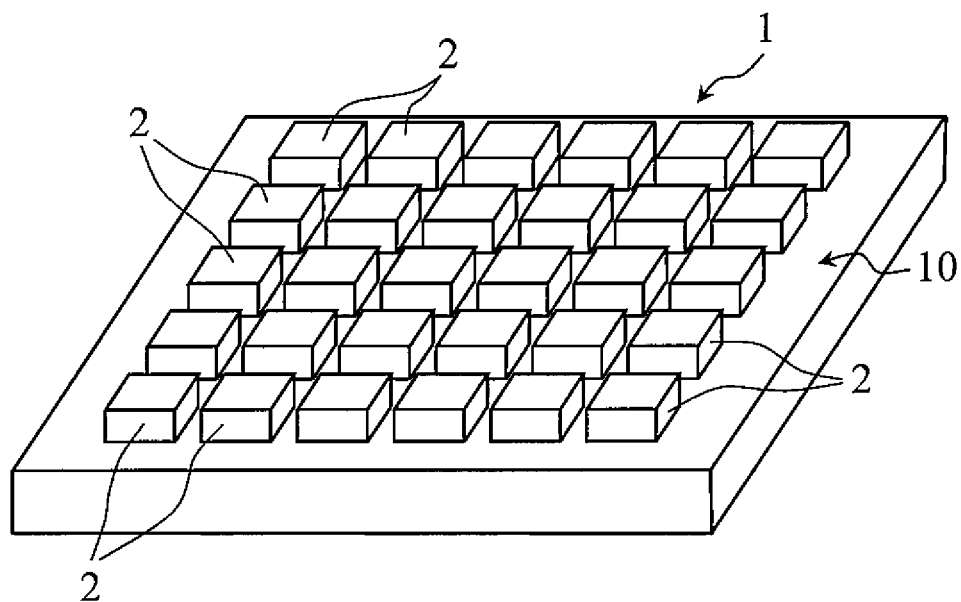
FIG. 1 is an overall perspective view illustrating an example of an illuminating device according to the present invention.

The illuminating device 1 shown in FIG. 1 includes a base board 10 and a plurality of light-emitting devices 2 arranged in matrix form on the base board. Planar light is emitted by using the plurality of light-emitting devices 2 simultaneously.

The base board 10 is formed with a wire 11 (see FIG. 3) in a pattern. The wire 11 is electrically connected to a bottom conductor 35 (see FIG. 3) of each of the light-emitting device 2 which is to be described below. With such structure, the light-emitting device 2 is supplied with external electrical force, and selectively turns the light on and off.

Figure 2:
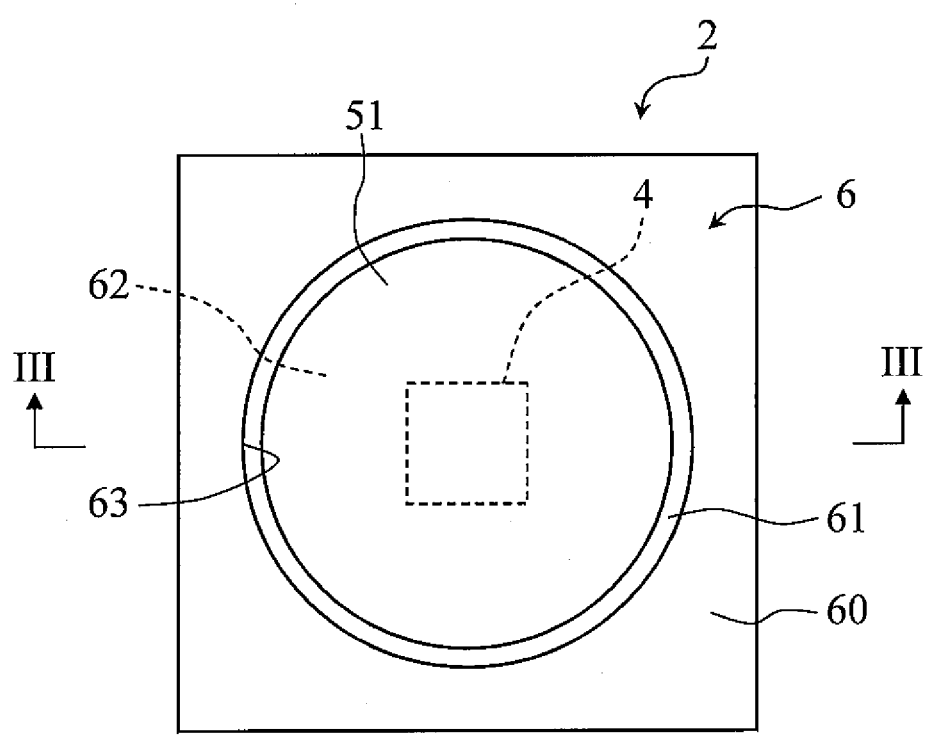
FIG. 2 is a plan view illustrating a light-emitting device of the illuminating device shown in FIG. 1.
Figure 3:
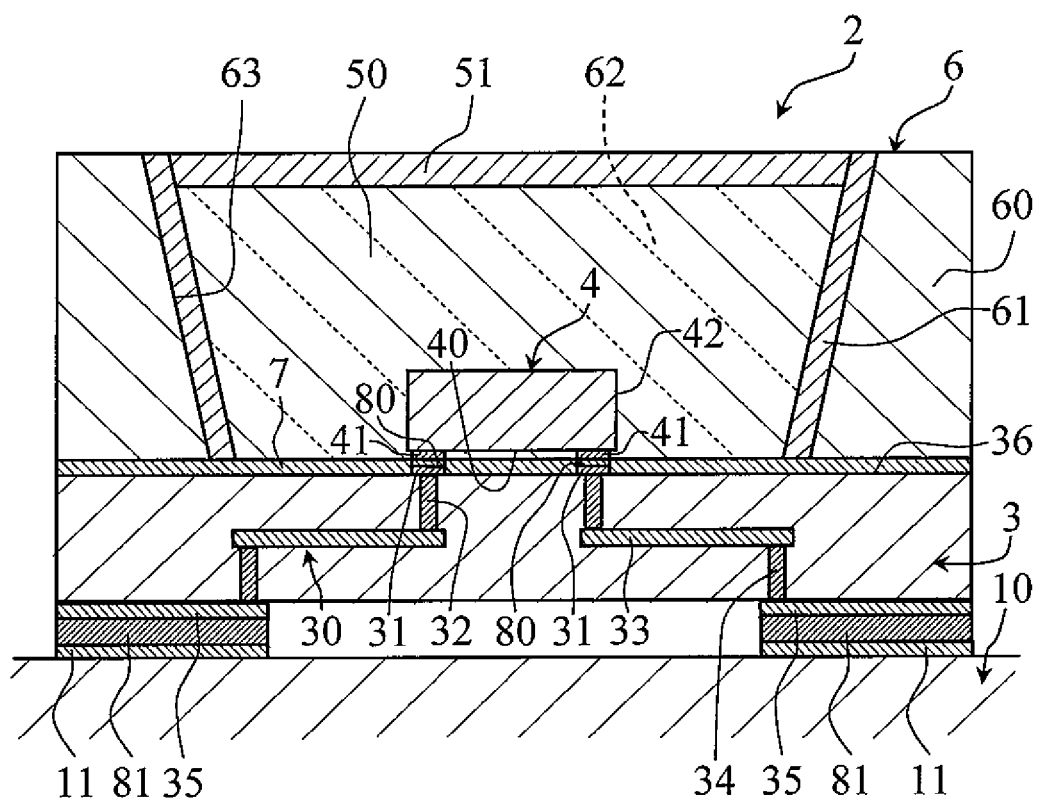
FIG. 3 is a section view taken along lines III-III of FIG. 2.

As shown in FIGS. 2 and 3, each of the light-emitting devices 2 includes a base 3, a light-emitting element 4, a translucent member 50, a wavelength conversion layer 51, first and second reflective members 6, 7.

The base 3 supports the light-emitting element 4 and a frame body 60 of the first reflective member 6 which is to be described below, and serves as an insulating body. The base 3 is made of sintered aluminum oxide, sintered aluminum nitride, sintered mullite, or a ceramics such as glass ceramics, for example.

The base 3 includes a wire conductor 30 electrically connected to the wire 11 of the base board 10 and to an electrode 41 of the light-emitting element 4 which is to be described later. The wire conductor 30 supplies electrical force for driving the light-emitting element 4, and includes a top conductor 31, a via conductor 32, an interlayer conductor 33, a via conductor 34, and a bottom conductor 35.

The base 3 including such a wire conductor 30 is made by preparing a plurality of green sheets to form the base 3, for example, and printing a metal paste of e.g. W, Mo, Mn, or Cu, to form the wire conductor 30, and then baking the metal paste together with the base 3.

Of course, the base 3 may be made of a resin such as epoxy resin, while the wire conductor 30 may be formed by a known method such as plating, thin-film forming method, on the surface or inside of the base 5. The wire conductor 30 formed at the exposed surfaces (the surfaces of the top conductor 31 and the bottom conductor 35) is preferably covered by a metal layer having high corrosion-resistance, such as Ni layer with a thickness of 0.5-9 μm or Au layer with a thickness of 0.5-5 μm. In this way, the surfaces of the wire conductor 30 are effectively prevented from oxidative corrosion. This facilitates firm bonding the top conductor 31 and the electrode 41 of the light-emitting element 4 which is to be described later, as well as between the bottom conductor 35 and the wire 11 of the base board 10, by using conductive bonding members 80, 81, such as solder.

The light-emitting element 4 emits light of a wavelength within a desired range, and is mounted on the base 3 by face-down method. The light-emitting element 4 includes a principal surface 40 formed with a circuit element (not shown), and an electrode 41 electrically connected to the circuit element (not-shown). The electrode 41 is electrically connected to the top conductor 31 of the wire conductor 30 via the conductive bonding member 80.

The conductive bonding member 80 is made of a brazing filler material, a solder material, a conductive bump, or a conductive bond. Examples of the brazing filler material and the solder material include tin systems, such as Au—Sn, Sn—Ag, Sn—Ag—Cu and Sn—Pb. The metal bump may be made of Au or Ag, for example, while the conductive bond may contain conductive balls dispersed in a resin component such as epoxy. Depending on the arrangement of the electrode 41 and a light-emitting area of the light-emitting element 4, wire bonding may be utilized for the electrical connection between the electrode 41 and the wire conductor 30.

The light-emitting element 4 emits light having a peak wavelength within a range of the ultraviolet region to the infrared light region, for example, or light having broadband property at a wavelength within the above range. The type (the wavelength property of emitted light) of the light-emitting element 4 is selected according to the color (wavelength) of light to be emitted by the light-emitting device 2. For example, in order to emit white light with high luminosity via the wavelength conversion layer 51 of the light-emitting device 2, the light-emitting element 4 preferably emits light at a short wavelength of 300-500 nm such as light of the near ultraviolet region to the blue light region, and more preferably, emits ultraviolet light or near ultraviolet light. The reason will be described below.

If the light-emitting element 4 emits visible light, part of the emitted light is converted to light of a complementary color by a fluorescent body (wavelength conversion layer 51), and the rest of the emitted light and the light of the fluorescent body are mixed to be white light. In this case, the wavelength of the light emitted by the light-emitting element 4 is likely to be changed due to temperature rise during operation, which causes imbalance in mixture of the emitted light and the light of the fluorescent body. Thus, it is difficult to stably obtain white light. Further, the intensity of light becomes lower as proceeding farther from the light source, and it is impossible to adjust color by the fluorescent body according to such variation in light intensity.

On the other hand, since ultraviolet light and near ultraviolet light have large energy, wavelength of most of the emitted light is converted by the fluorescent body. Thus, only the balance in mixture of light from the fluorescent body is to be considered, and there is no need to consider the balance between the emitted light and the light of the fluorescent body. Therefore, in order to emit white light with high luminosity from the light-emitting device 2, the light-emitting element 4 is preferably selected to emit ultraviolet light and near ultraviolet light.

Such light-emitting element 4 for emitting ultraviolet light and near ultraviolet light is preferably selected from a LED and a LD, such as a gallium nitride compound semiconductor and a silicon carbide semiconductor, having a laminated structure of a buffer layer, a N-type layer, a light-emitting layer, and a P-type layer, formed of Ga—N, Al—Ga—N, and In—GaN, on a sapphire substrate.

The translucent member 50 serves to prevent the light-emitting element 4 from being exposed to the moisture in the air, and is provided inside the frame body 60 of the first reflective member 6, which is to be described below, to seal the light-emitting element 4. The translucent member 50 also serves to reduce the difference in refractive index between the light-emitting element 4 and its surround, thereby preventing light from being shut in the light-emitting element 4, and thus increasing the light intensity at the light-emitting element 4.

The translucent member 50 is made of a material to have a refractive index similar to that of the light-emitting element 4, and allows passage of the light emitted by the light-emitting element 4 at a high transmittance. Examples of the material meeting the above requirement are silicone resin, epoxy resin, a transparent resin such as urea resin, low-melting glass, and a transparent glass such as sol-gel glass.

Such translucent member 50 is made by filling an uncured or melted material into the frame body 60 using e.g. dispenser, and then solidifying the material.

The wavelength conversion layer 51 serves to convert wavelength (color) of light emitted by the light-emitting element 4, and is positioned right above the light-emitting element 4 to cover the translucent member 50. The wavelength conversion layer 51 contains a phosphor corresponding to a wavelength to which the wavelength of the emitted light is to be converted.

Examples of the phosphor include yttrium-aluminum-garnet phosphor reactivated by at least one element selected from alkaline earth aluminate phosphor and rare earth element, for example.

Such wavelength conversion layer 51 may be provided to cover the light-emitting surface of the light-emitting element 4, and may be omitted if the light from the light-emitting element 4 is utilized without converting the wavelength.

The first and second reflective members 6, 7 serve to reflect the light emitted by the light-emitting element 4 and then emit the light to the outside of the light-emitting device 2, and are positioned to surround the light-emitting element 4.

The first reflective member 6 includes a frame body 60 and a reflective layer 61, and is bonded to the base 3 via a bonding member. The bonding member may be made of a solder material, a brazing filler material, or a resin bond. Examples of the solder material and the brazing filler material include tin systems, such as Ag—Cu, Pb—Sn, Au—Sn, Au—Si, and Sn—Ag—Cu. The resin bond may be made of a silicone or an epoxy resin. However, when the bonding between the base 3 and the frame body 60 needs a high reliability, the bonding member is preferably made of a solder material or a metal brazing filler material.

The frame body 60 supports the reflective layer 61, and includes an inner space 62 having a circular section. Specifically, the frame body 60 includes an inner surface 63 which defines the inner space 62, and the reflective layer 61 is formed in contact with the inner surface. The inner space 62 accommodates the light-emitting element 4, and the translucent member 50 provided therein.

The frame body 60 is made of a metal such as aluminum, ceramics, or resin, for example. However, the frame body 60 is preferably made of a material having a thermal expansion coefficient similar to that of the base 3, in order to prevent the influence of the thermal stress applied between the base 3 and the frame body 60. For example, when the base 3 is made of ceramics, it is preferable that the frame body 60 is also made of ceramics. In this case, the base 3 and the frame body 60 may be formed simultaneously by green sheet method.

The reflective layer 61 reflects the light emitted by the light-emitting element 4, so that the light is emitted upwardly from the light-emitting device 2 as seen in the figures. The reflective layer 61 is provided in contact with the inner surface 63 of the frame body 60, and surrounds side surfaces 42 of the light-emitting element 4.

The second reflective member 7 is provided in contact with an upper surface 36 of the base 3, and extends in a plane right below the light-emitting element 4. The second reflective member 7 serves as a reflective layer as a whole.

Figure 4:
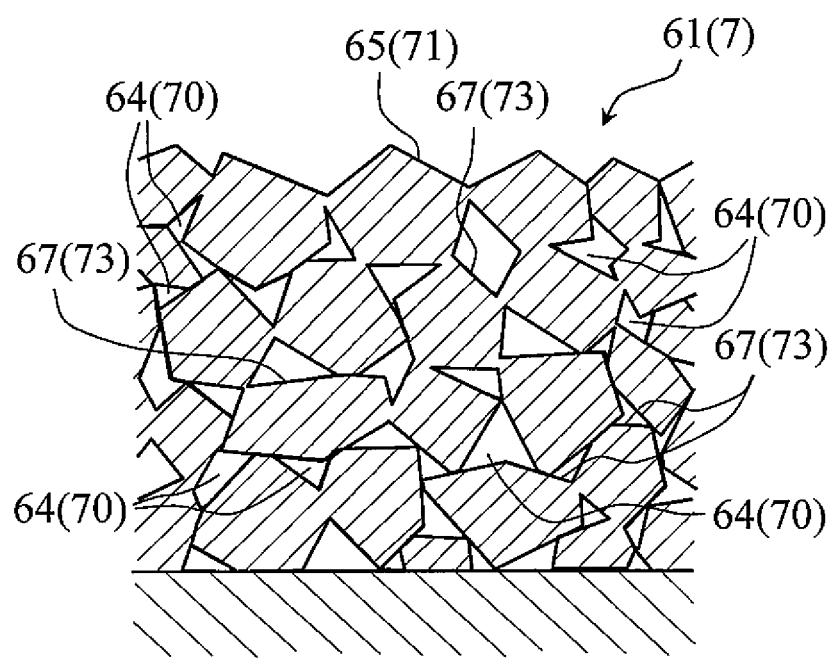
FIG. 4 is a section view illustrating the principal portion (reflective layer) of the light-emitting device shown in FIGS. 1 and 2.
Figure 5:
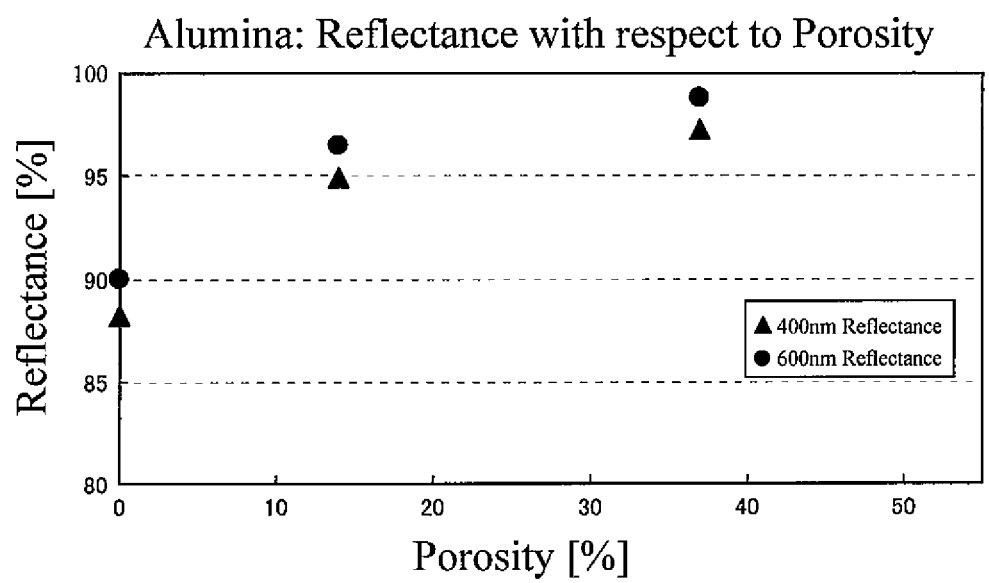
FIG. 5 is a graph indicating measurement results in Example 1, when using alumina as inorganic particles.
Figure 6:
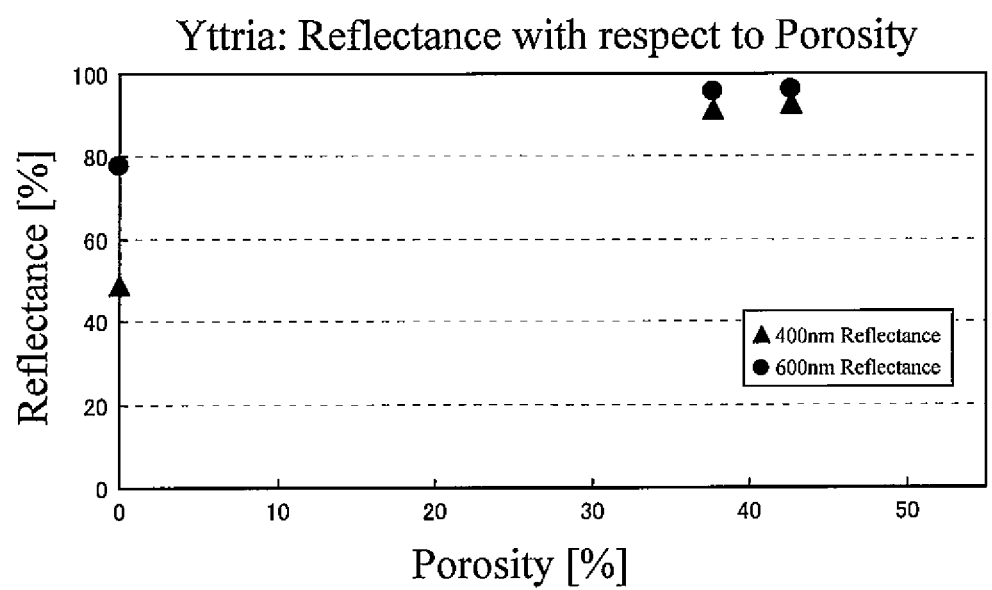
FIG. 6 is a graph indicating measurement results of porosity and reflectance in Example 1, when using yttria as inorganic particles.
Figure 7:
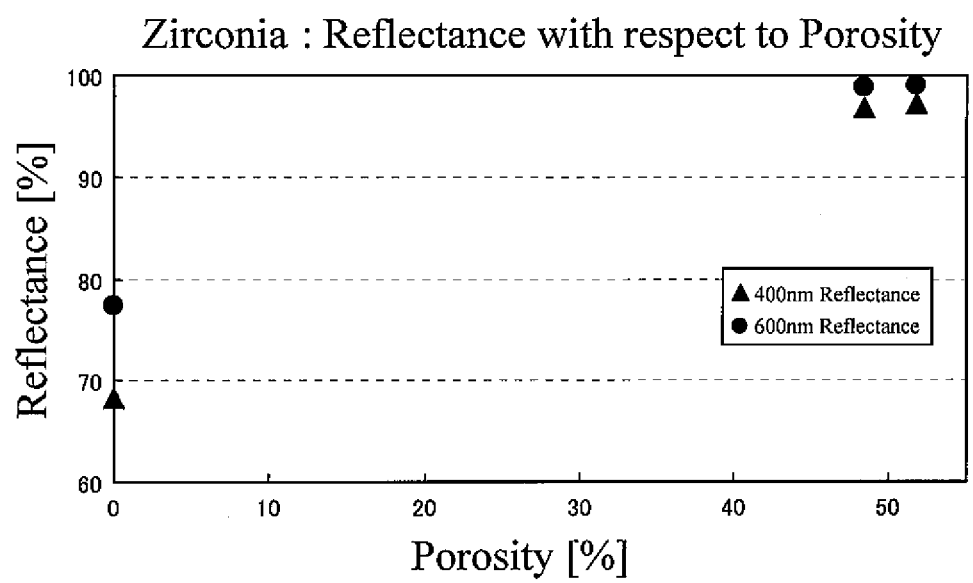
FIG. 7 is a graph indicating measurement results of porosity and reflectance in Example 1, when using zirconia as inorganic particles.
Figure 8:
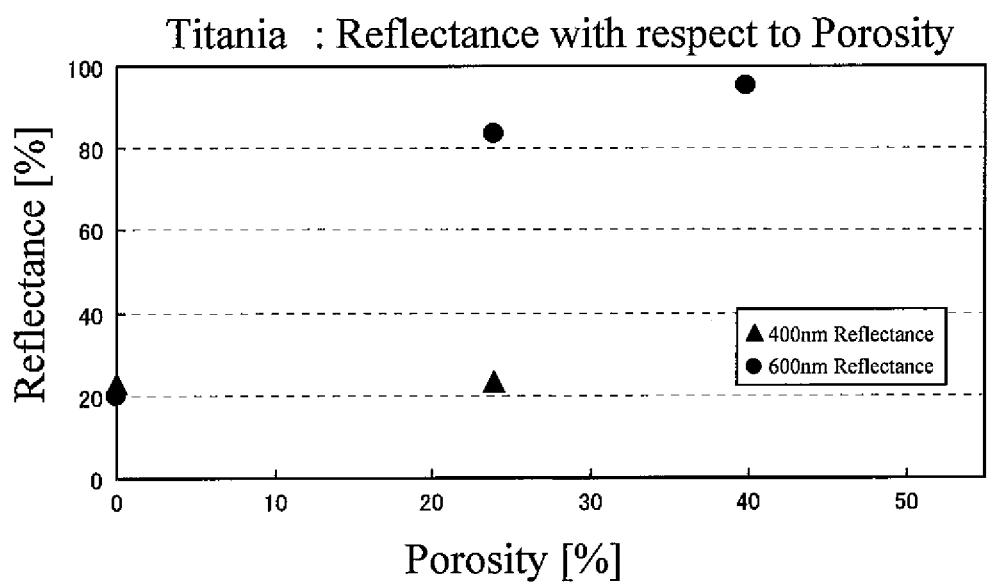
FIG. 8 is a graph indicating measurement results of porosity and reflectance in Example 1, when using titania as inorganic particles.

As shown in FIG. 4, the reflective layer 61 and the second reflective member 7 are formed to be porous using an inorganic material. Specifically, each of the reflective layer 61 and the second reflective member 7 is a porous body that includes a plurality of inorganic particles partly combined with each other, and thus has a plurality of holes 64 (70). The holes 64 (70) are filled with a gas (or air).

With such porous reflective layer 61 and the second reflective member 7, light passes through surfaces 65 (71) of the reflective layer 61 and the second reflective member 7, to enter from the outside air with a low refractive index into the inorganic particles with a high refractive index. Part of such incident light is totally reflected due to the difference in refractive index, at a boundary surface between a surface 67 (73) of one of the inorganic particles and the air in one of the holes 64 (70) having a refractive index lower than that of the inorganic particle, while the rest of the incident light passes therethrough. Specifically, when the boundary surface between the surface 67 (73) of the inorganic particle and the air in the hole 64 (70) exists at a total reflection angle to the light incident angle, nearly 100% of the incident light is reflected. On the other hand, when the boundary surface between the surface 67 (73) of the inorganic particle and the air in the holes 64 (70) does not exist at a total reflection angle to the light incident angle, the incident light passes therethrough. On the light path of the light after passing through the boundary surface, a plurality of boundary surfaces between the surfaces 67 (73) of the inorganic particles and the air of the holes 64 (70) exist, and a large proportion of the boundary surfaces exist at a total reflection angle to the light incident angle. As a result, nearly 100% of the light entering into the reflective layer 61 and the second reflective member 7 is reflected by any one of the boundary surfaces. By succession of such light reflection, light entering into the reflective layer 61 and the second reflective member 7 is efficiently reflected, and emitted out of the reflective layer 61 and the second reflective member 7. In other words, when light enters into the surface 65 (71) of the reflective layer 61 and the second reflective member 7, nearly 100% of the incident light is emitted back to the outside air from the surface of the reflective layer 61 and the second reflective member 7, while nearly 0% of the incident light passes through the reflective layer 61 and the second reflective member 7.

As can be seen from the above description, in view of efficiently reflecting the incident light, it is preferable that each of the inorganic particles has a high refractive index and thus a wide critical angle of total reflection. In view of reducing light attenuation at the reflective layer 61 and the second reflective member 7, it is preferable to use a material with a low absorption against the incident light (light absorption of not more than 5%, for example). If the reflective layer 61 and the second reflective member 7 are formed to have a laminated structure, it is preferable to have a thickness of not less than 0.03 mm. With a thickness of less than 0.03 mm, a large proportion of light may pass therethrough.

Further, for reflecting and emitting a large proportion of the incident light entered into the reflective layer 61 and the second reflective member 7, it is preferable to make the porosity therein to be 15-43%. If the porosity is unduly low, the number of the holes 64 (70) is reduced, the number of the surfaces contributing to light reflection is reduced (inner surface area is reduced), and thus the light reflectance is reduced. On the other hand, if the porosity is unduly high, the strength of the reflective layer 61 and the second reflective member 7 is lowered.

Here, the porosity indicates the total porosity measured by geometrical method, and is defined as the following Formula 1.

Formula 1

$$\text{Porosity (\%)} = (1 - \text{Bulk Density}/\text{Real Density}) \times 100$$

In Formula 1, the bulk density is measured by the Archimedes method, while the real density is measured by gas phase displacement method (pycnometer method). When the reflective layer has a small thickness, the porosity can be obtained by observing a section of the reflective layer using a microscope, calculating the area ratio of pores (by dividing the total area of pores by the total area of the section), and then raising the area ratio of pores to the 3/2 power.

Such reflective layer 61 and the second reflective member 7 are made by forming an inorganic-particle layer containing a plurality of inorganic particles on the inner surface 63 of the frame body 60 or on the upper surface 36 of the base 3, and then calcining the inorganic-particle layer.

Here, calcination is an incomplete baking for forming a porous body with a suitable porosity, differently from that of a sintered body (ceramics) in which very little air gaps exist between the inorganic particles (with porosity of 0.001-1%).

The inorganic-particle layer is made by performing spray coat of a material which is a mixture of inorganic particles and a binder resin, for example.

Examples of the binder resin include acrylic resin, paraffin resin, and polyethylene resin.

As described above, as the inorganic particles, it is preferable to use a material with a low absorption against the incident light (light absorption of not more than 5%, for example), and with a high refractive index and thus a wide critical angle of total reflection. Examples of such a material typically include alumina, yttria zirconia, titania, diamond, calcium oxide, and barium sulfate. Preferably, the inorganic particles are nonmetal inorganic particle. If containing metal, the inorganic particles prevent passage of light, and thus light is blocked within the holes 64 (70), which may increase the light loss.

Among the above inorganic materials, in view of refractive index, it is especially preferable to use a material with a wide critical angle of total reflection, such as titania (rutile; n=2.8), zirconia (n=2.1), and diamond (n=2.4).

Further, the inorganic material may be selected according to wavelength of incident light, in view of light absorption (or transmittance). For example, titania is preferable in view of refractive index, though has light-absorbing property effective in near ultraviolet region of light wavelength of about 350 nm. Thus, in order to make the reflective layer 61 and the second reflective member 7 to be capable of reflecting near ultraviolet light at wavelength of about 350 nm, it is preferable to use alumina that is less likely to absorb near ultraviolet light.

Each of the inorganic particles preferably has as small particle diameter as possible, and is at least larger than one-fourth of the wavelength of the incident light. If the particle diameter of the inorganic particle is smaller than one-fourth the wavelength of the incident light, an apparent difference in refractive index with respect to the light is reduced, and thus light reflection is prevented. On the other hand, if the particle diameter of the inorganic particle is too large, the inner surface area, or the reflective surface area at the holes 64 (70) is reduced. Further, in view of totally reflecting the incident light at a high rate, an irregular form such as a plate or a column is preferable for the inorganic particles than a sphere.

Calcination of the inorganic particle layer is normally performed at 1000-1400° C. for 1-5 hours, though depending on the inorganic material to be used as well as the desired porosity and deflective strength. In calcination, an auxiliary agent may be used for lowering the baking temperature. In this case, calcia or magnesia is used, for example, at an amount of 1-10 wt %.

In such calcination, the inorganic particles are combined with each other, to obtain a porous body with a proper porosity of 15-43% and a deflective strength of 1-300 MPa, for example. When the inorganic particle layer contains a binder resin, the binder resin evaporates or burns to be removed due to the heat in calcination.

Each of the reflective layer 61 and the second reflective member 7 may also be formed as a porous body in which inorganic particles are combined with each other using an adhesive. Such porous body is formed by applying a material containing inorganic particles, an adhesive, and a solvent to the inner surface 63 of the frame body 6 or the upper surface 36 of the base 3, and then vaporizing the solvent. In this case, the adhesive remains in the porous body. Thus, in order to prevent decrease in reflectance due to light absorption by the adhesive, it is preferable that the adhesive has translucency. Examples of such an adhesive include a resin adhesive such as epoxy resin, silicone resin, fluorine resin, acryl resin, urea resin, methacrylic resin, and polycarbonate resin, as well as a glass adhesive such as low-melting glass, sol-gel glass, and Si—Mg—Al—O system.

Further, the reflective layer 6 and the second reflective member 7 may be formed separately from the inner surface 63 of the frame body 6 and the upper surface 36 of the base 3, and bonded on the inner surface 63 of the frame body 6 and the upper surface 36 of the base 3. The first reflective member 6 may be entirely formed as a porous body using an inorganic material. In this case, the first reflective member 6 includes only the porous body and the frame body 60 is omitted. With such structure, the surface to be irradiated with light serves as a proper reflective surface, while the porous body of the first reflective member 6 serves as a heat insulator, and efficiently prevents temperature rise at the outer surface of the light-emitting device. Such porous body is made as described below.

First, inorganic particles and binder resin are mixed into a compact. Materials similar to the above-described materials are used as the inorganic particles and the binder resin. The compact is made by pressing process using a metal mold. If the compact is to be formed into a film, α-terpineol and a solvent such as toluene is added to the above mixture to make slurry, which is molded on a tape using a doctor blade, and then the solvent is vaporized.

The base 3 may also entirely formed as a porous reflective member. In this case, the surface to be irradiated with light serves as a proper reflective surface, while the frame body 60 and the base 3 serve as heat insulators, and efficiently prevent temperature rise at the outer surface of the light-emitting device.

Next, the compact is calcinated. The conditions of the calcination are the same as described above. In such calcination, the binder resin evaporates or burns to be removed, and a porous body with a suitable porosity is obtained.

As described above, in the light-emitting device 2, the first reflective member 6 (reflective layer 61) and the second reflective member 7 are made to be porous. With such structure, light emitted by the light-emitting element 4 enters into the first and second reflective members 6 (7), and is totally reflected at the boundary surfaces between the inorganic particles and the air in the holes 64 (70). Specifically, since the air inside the holes 64 (70) has a refractive index lower than that of the inorganic particles a difference between the refractive indexes of the inorganic particles and the air in the holes 64 (70) contributes to total reflection of part of the incident light at the boundary surfaces (reflective surfaces). Since the reflective layer 61 of the first reflective member 6 and the second reflective member 7 are made to be porous, a number of holes 64 (70) exist therein. Thus, a number of boundary surfaces (reflective surfaces) for efficiently reflecting the incident light exist in the first reflective member 6 (reflective member 61) and the second reflective member 7, so that the incident light entering into the first reflective member 6 and the second reflective member 7 is reflected efficiently. As a result, when light enters into the surfaces 65 (71) of the first and second reflective members 6 (7), nearly 100% of the incident light is emitted back to the outside air from the surfaces 65 (71) of the first and second reflective members 6 (7), while nearly 0% of the incident light passes through the first and second reflective members 6 (7).

Further, by making the first reflective member 6 (reflective layer 61) and the second reflective member 7 of an inorganic material, the light resistance and the heat resistance become higher than by making of an organic material, and the reflection efficiency is reliably prevented from deterioration due to material degradation. Thus, in the light-emitting device 2, stable reflection efficiency and thus stable light emission are maintained. Such effect is also obtained even when using an LED chip or an LD chip as the light-emitting element for emitting light of high energy such as ultraviolet light, near ultraviolet light, and blue light. In other words, by using the reflective members 6, 7 according to the present invention, in the light-emitting device 2 provided with the light-emitting element 4 for emitting light of high energy, the reflection efficiency and the light emission is reliably prevented from deterioration due to degradation of the reflective members 6, 7.

The present invention is not limited to the above-described embodiment, but may be variously changed. For example, in the reflective layer 61 of the first reflective member 6 and the second reflective member 7, the holes 64, 70 may be filled with a transparent material having a refractive index smaller than that of the inorganic material. However, if the reflective layer 61 of the first reflective member 6 and the second reflective member 7 are made as porous bodies in which inorganic particles are combined with each other by an adhesive, the refractive index of the transparent material for filling in the holes 64 (70) is also smaller than that of the adhesive, not only the inorganic material forming the porous body.

Further, in the above-described embodiment, the reflective members are applied to the light-emitting device includes, but the present reflective members may also used for reflecting heat (infra-red ray), X-ray, and other electromagnetic rays.

Further, the above-described light-emitting device 2 includes the first and second reflective members 6, 7, but one of the reflective members 6, 7 may be omitted.

In the above-described embodiment, the illuminating device includes a plurality of light-emitting devices arranged in matrix. However, the light-emitting devices may be arranged in a line, or only one light-emitting device may be used as an illuminating device. Further, the light-emitting device and the reflective member according to the present invention may be applied to a display device.

The reflective member according to the present invention may be used as a substrate for a solar battery including the substrate and a semiconductor layer made of e.g. silicon (see JP-A-2001-203373).

In such a solar battery, light entered from the surface of the solar battery passes through the semiconductor layer and arrives to the reflective member. The light is diffusedly reflected with low loss at the porous surface of the reflective member, and repeatedly reflected by the surface of the semiconductor layer and the surface of the substrate, while passing through the semiconductor layer a number of times. Since the light is absorbed by the semiconductor layer every time passing therethrough to generate electricity, the electric generation efficiency of the solar battery is enhanced.

Further, by making the reflective member of ceramics, a difference in heat expansion coefficient between the reflective member and a silicon material is reduced. Thus, the semiconductor layer can be made of silicon on the reflective member at high quality.

The reflective member according to the present invention may also be applied to a solid laser device (see JP-A-2004-7012), and used in a condenser for collecting laser light from a solid state component. The condenser includes an inner surface as a diffuse reflector, and an opening from which light of a semiconductor laser is introduced, and accommodates a solid state component, such as Nd:YAG, containing an active medium which is excited by laser light from the semiconductor laser.

In the condenser using the present reflective member, light from the semiconductor laser is diffusedly reflected with low loss, and the reflected light is transmitted in the condenser with nearly uniform intensity. In this way, the solid laser device excites the solid state element without deteriorating laser efficiency and beam quality.

EXAMPLE 1

In the present example, a study was made on a relationship between porosity and reflectance of reflective members made of inorganic particles of various inorganic materials.

(Manufacture of Reflective Member)

In manufacture of the reflective members, first, inorganic particles of alumina, zirconia, yttria, and titania, were respectively prepared. The inorganic particles were respectively weighed and mixed with particles of calcia, silica, and magnesia at weight ratios of 9.2:0.2:0.5:0.1, to make mixtures.

Next, each of the above mixtures was further mixed with acryl resin at weight ratio of 9:1, and put into a ball mill together with toluene and alumina balls for 24 hours, to prepare slurry. The slurry was dried by spray drying into powder.

Successively, 1 g of the above powder was pressed by a hand presser at a pressure of 1 t, to be molded into a tablet with a diameter of 20 mm.

Finally, the tablet was baked under the conditions shown in the following Table 1, to obtain the reflective member according to the present example.

TABLE 1

| Inorganic Particles | Baking Conditions | | Porosity [%] |
| --- | --- | --- | --- |
| | Temperature [° C.] | Time [hour] | |
| alumina | 1200 | 2 | 37 |
| | 1400 | 2 | 14 |
| | 1600 | 2 | 0 |
| yttria | 1200 | 2 | 42 |
| | 1400 | 2 | 38 |
| | 1600 | 2 | 0 |
| zirconia | 1000 | 2 | 51 |
| | 1200 | 2 | 48 |
| | 1400 | 2 | 0 |
| titania | 1000 | 2 | 40 |
| | 1200 | 2 | 24 |
| | 1400 | 2 | 0 |

Here, the porosity indicates the total porosity measured by geometrical method (see Formula 1). The bulk density was measured by the Archimedes method, while the real density was measured by gas phase displacement method (pycnometer method).

(Measurement of Reflectance)

The reflectance was measured by a spectrophotometer (CM-3700d, manufactured by Konica Minolta). The surface of each the above samples of reflective member was irradiated by light of a xenon lamp, and the light was reflected on the surface. Intensity of the reflected light was measured, and a ratio of intensity of the incident light and the reflected light was calculated as the reflectance. The measurement was performed at wavelength of 400 nm or 600 nm.

Measurement results of the reflectance are shown in FIGS. 5-8 each illustrating a graph with porosity on the horizontal axis. FIGS. 5-8 show measurement results with respect to alumina, zirconia, and yttria, and titania respectively.

As can be seen from FIGS. 5-8, within the range of the measured porosity, the reflectance gets higher as the porosity gets higher. Especially when the porosity is within the range of 10-50%, the reflectance is significantly higher than when the porosity is 0% (ceramics). Thus, when making the reflective member, it is preferable to adequately form air gaps using inorganic particles, so that the reflective member has a porous body.

EXAMPLE 2

In the present example, a study was made on a relationship between porosity and reflectance of the reflective member made of alumina particles. Further, as a comparative sample, reflectance was also measured using a reflectance standard "Spectralon" (registered mark) manufactured by Labsphere.

Manufacture of the reflective member, measurement of porosity and reflectance were performed basically in the same way as Example 1. The porosity was adjusted by changing the baking conditions. The baking conditions as well as measurement results of porosity and reflectance are shown in the following Table 2. Measurement results of porosity and reflectance are also indicated by graphs with porosity on the horizontal axis and reflectance on the longitudinal axis. The graphs of measurement results at wavelength of 400 nm and 600 nm are shown in FIGS. 9A and 9B, respectively.

TABLE 2

| | Baking Conditions | | | Reflectance [%] | |
|---|---|---|---|---|---|
| | Temperature [° C.] | Time [hour] | Porosity [%] | 400 nm | 600 nm |
| Samples | 1450 | 2 | 5.7 | 88.2 | 89.9 |
| | 1400 | 2 | 13.5 | 94.9 | 96.4 |
| | 1350 | 2 | 14.8 | 95.8 | 97.3 |
| | 1280 | 2 | 21.5 | 96.4 | 98.2 |
| | 1200 | 2 | 36.6 | 97.3 | 98.8 |
| | 1100 | 2 | 41.0 | 98.0 | 99.2 |
| | 1050 | 2 | 43.1 | 95.5 | 98.2 |
| | 950 | 2 | 44.9 | 93.0 | 95.8 |
| Comparative Sample | — | — | — | 95.1 | 96.9 |

Figure 9A:
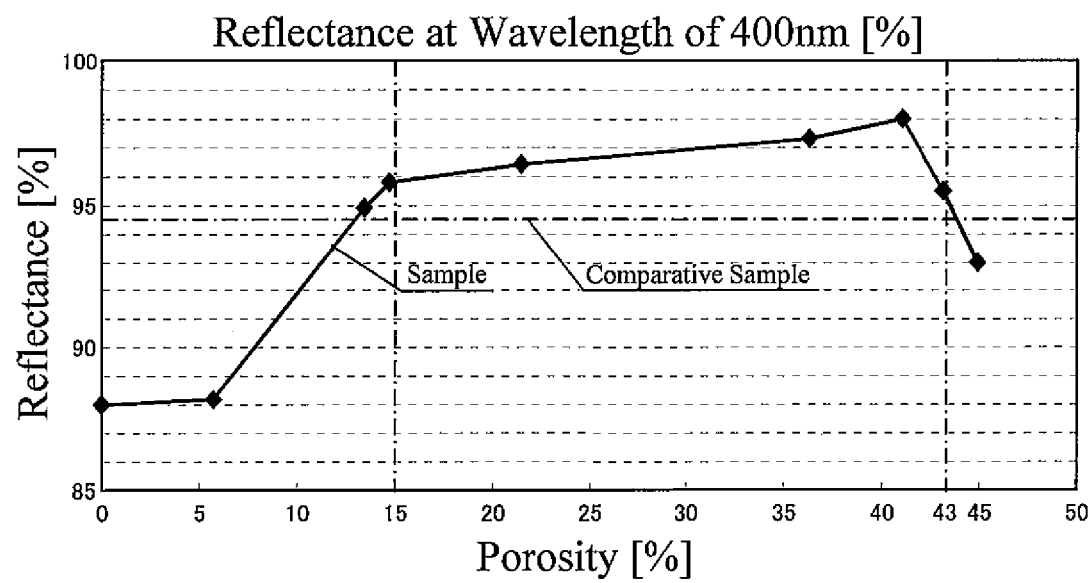
FIGS. 9A and 9B respectively show the graphs of measurement results at wavelength of 400 nm and 600 nm.
Figure 9B:
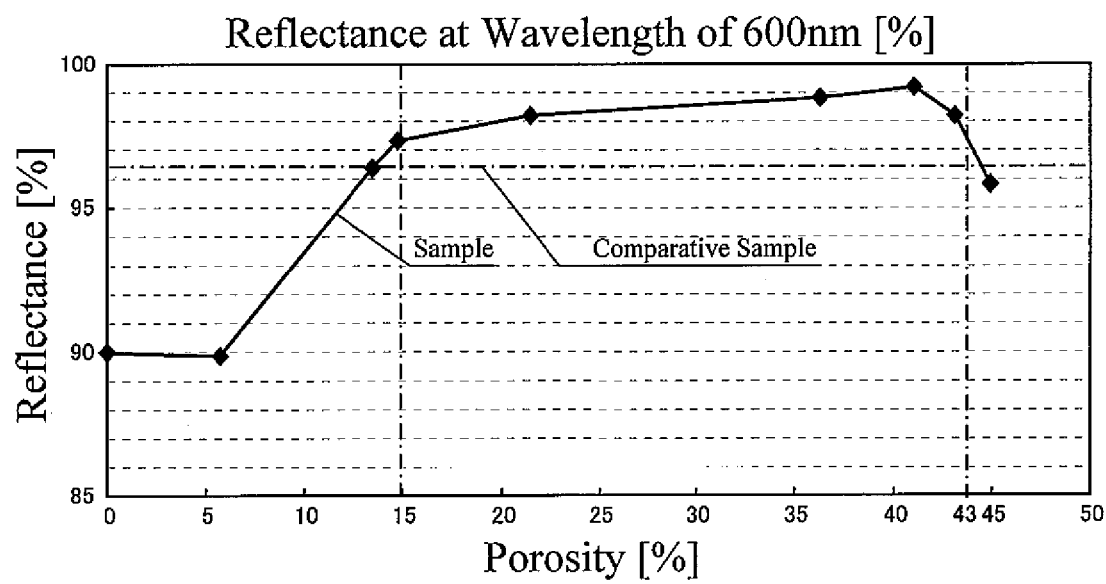

As seen from Table 2 and FIGS. 9A and 9B, in the reflective members made of alumina particles, when the porosity ranges from 10 to 45%, the reflectance is relatively high regardless of wavelength. Especially when the porosity ranges from 15 to 43%, the reflectance is higher than that of the reflectance standard of the comparative sample. Thus, when forming the reflective member of alumina, it is preferable to set the porosity within the range of 15-43%.

Though alumina particles were used in the present example, as can be seen from the results of Example 1, even when using other inorganic particles, a reflective member with a high reflectivity is provided by setting the porosity within the range similar to that of the samples using alumina particles.

EXAMPLE 3

Figure 10A:
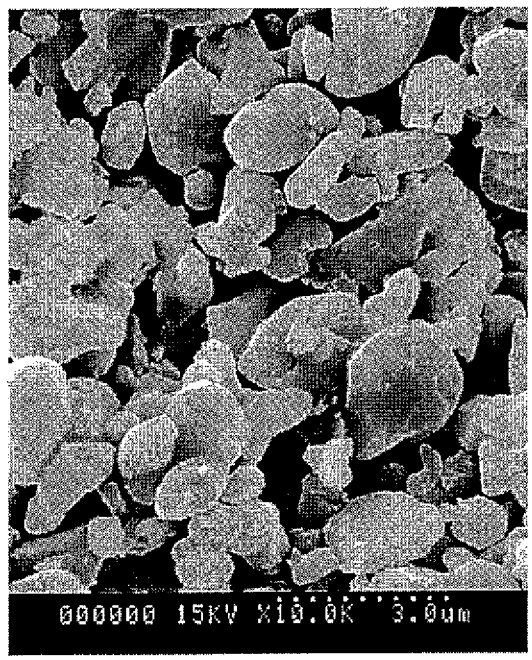
FIGS. 10A and 10B respectively show the photographs of surface texture and section texture.
Figure 10B:
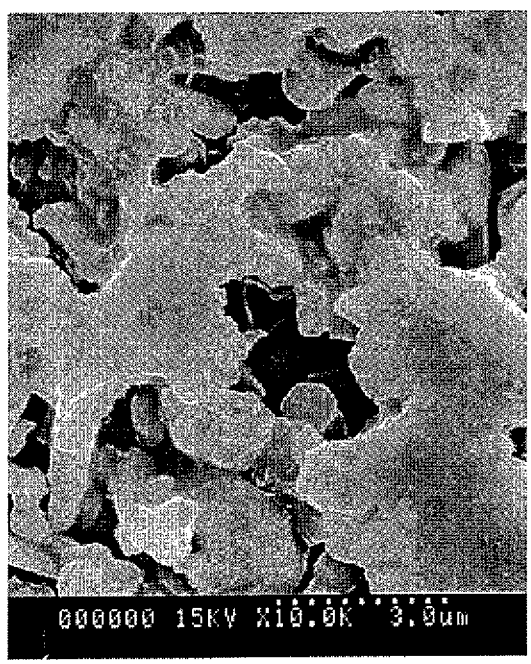

In the present example, surface texture and section texture were observed using the reflective member (according to the present invention) made in Example 2, with a porosity of 37%. The surface texture and the section texture were observed by a scanning electron microscope (SEM), and the photographs were taken as shown in FIGS. 10A and 10B. FIGS. 10A and 10B are photographs of surface texture and section texture of the present reflective member (reflective layer), respectively.

Figure 11A:
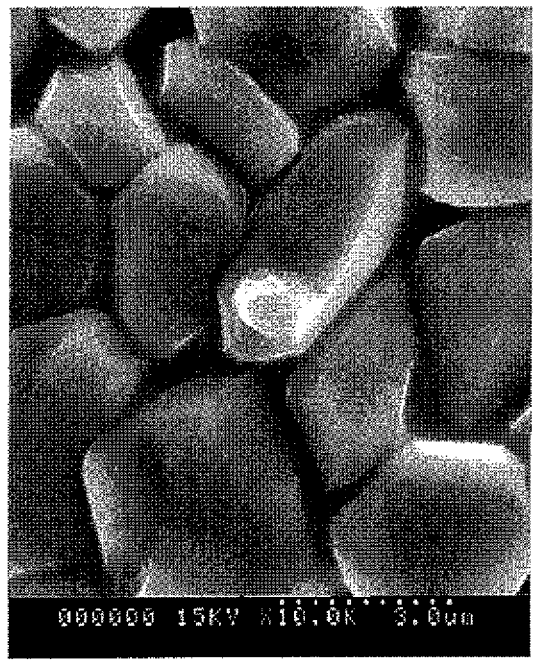
FIGS. 11A and 11B respectively show the photographs of surface texture and section texture.
Figure 11B:
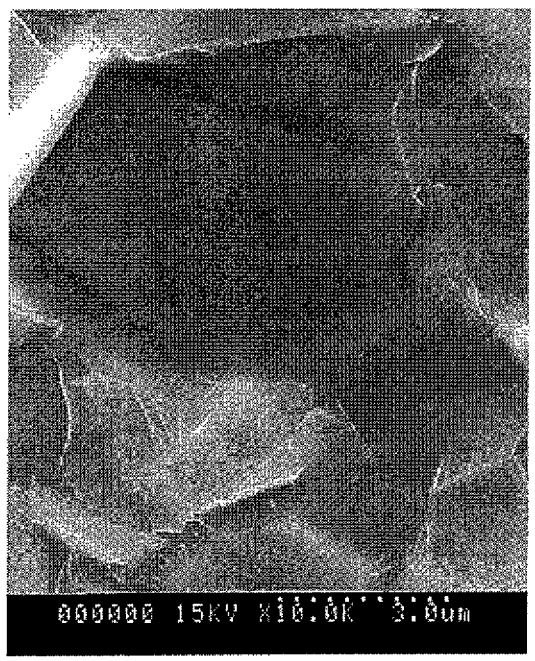

For reference, FIGS. 11A and 11B are photographs of surface texture and section texture of an alumina ceramics having a porosity of 0%, prepared as a comparative sample. FIGS. 11A and 11B show the surface texture and section texture of the reflectance standard of the comparative sample, respectively.

As can be seen from FIGS. 10A and 10B, in the present reflective member, alumina particles are partly combined with each other to form a porous body. With such structure of the present invention, the reflective area in the reflective member is relatively large, and thus a large proportion of the boundary surfaces exist at a total reflection angle to the light incident angle. As a result, light entering in the reflective member is efficiently reflected by the boundary surfaces and efficiently emitted out.

EXAMPLE 4

In the present example, the light-emitting device according to the present invention was evaluated as described below. First, as shown in FIG. 3, the base 3 including the wire conductor made of tungsten metallization was formed of an alumina sintered body (the second reflective member 7 shown in FIG. 3 was not formed on the principal surface).

Next, the frame body 60 was formed of various materials and bonded on the base 3. In the present sample, the frame body 60 was entirely a porous body made by heating aluminum oxide crystal to have a porosity of 36.6%. The frame body 60 served as the reflective member. As comparative samples, reflective members with frame bodies entirely made of aluminum and alumina sintered body (with porosity of 0%) were also prepared.

Finally, various LED elements with different peak wavelengths were mounted on the base 3, and then the frame body was filled with silicone resin, thereby manufacturing light-emitting devices for evaluation.

Values of reflectance at the frame bodies with respect to peak wavelengths of various LED elements are shown in Table 3. Further, values of light intensity of the light-emitting devices using such various LED elements are shown in FIGS. 12 and 13.

TABLE 3

| Peak Wavelength of LED Element (nm) | Reflectance at Reflective Member with respect to Peak Wavelength of LED Element | | |
|---|---|---|---|
| | Sample according to the Present Invention | Comparative Sample (aluminum) | Comparative Sample (alumina sintered body with porosity of 0%) |
| 365 | 95.3 | 77.3 | 82.9 |
| 370 | 95.8 | 78.0 | 83.3 |
| 381 | 96.3 | 79.3 | 86.0 |
| 386 | 96.6 | 79.8 | 86.4 |
| 394 | 97.1 | 80.8 | 87.8 |
| 403 | 97.3 | 81.2 | 88.1 |
| 453 | 97.7 | 84.9 | 89.5 |

Figure 12:
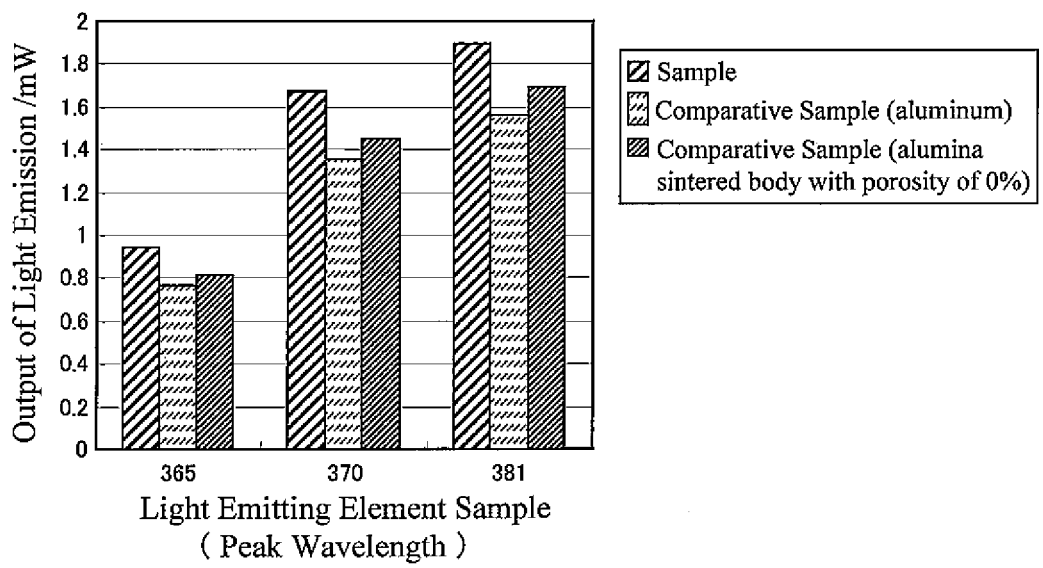
FIG. 12 is a graph indicating measurement results in Example 4.
Figure 13:
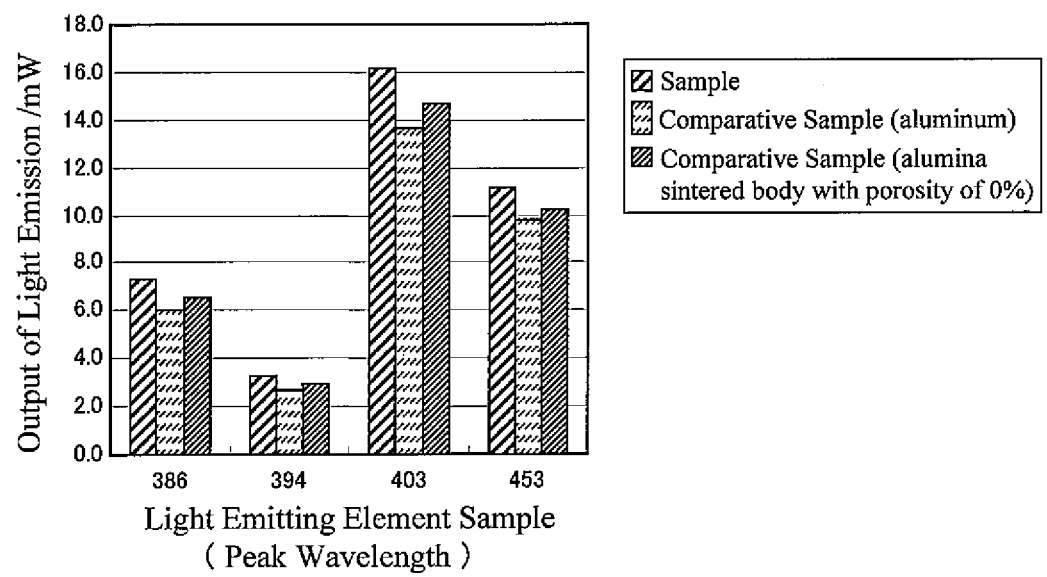
FIG. 13 is a graph indicating measurement results in Example 4.
Figure 14:
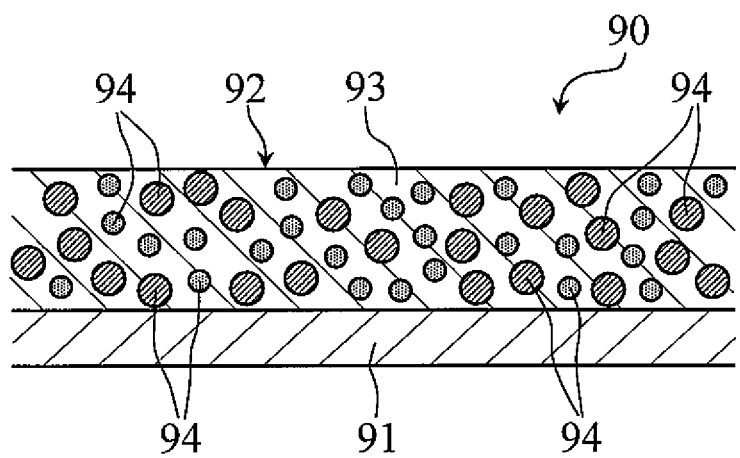
FIG. 14 is a section view illustrating an example of a conventional reflective member.
Figure 15:
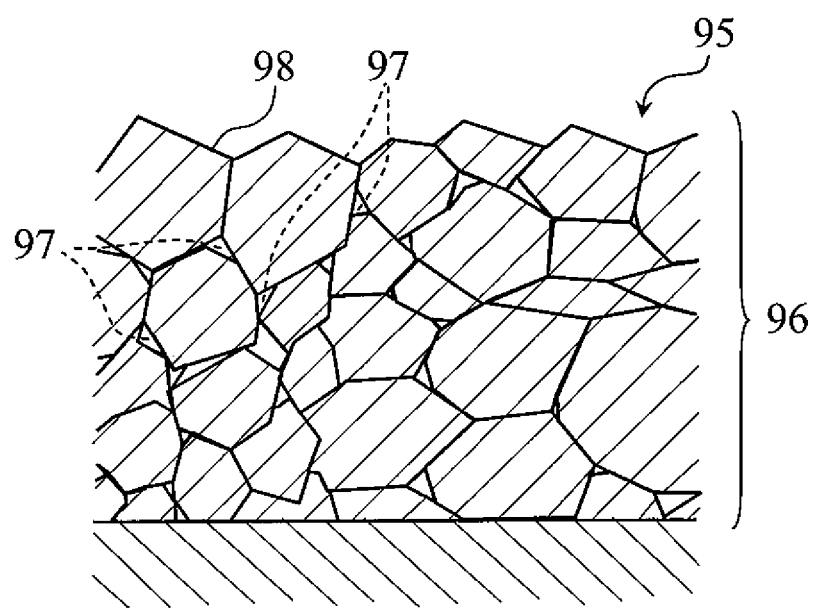
FIG. 15 is a section view illustrating another example of a conventional reflective member.

As can be seen from the results shown in Table and FIGS. 12 and 13, the light-emitting device according to the present invention, in which reflectance at the reflective member is not less than 95%, has light intensity higher than that of the comparative examples.

The invention claimed is:

1. A reflective member comprising:
   a porous reflective layer comprising an inorganic material and a plurality of pores, the inorganic material comprising a plurality of inorganic particles partially combined with each other; and
   a transparent adhesive in the plurality of pores,
   wherein the transparent adhesive has a refractive index lower than a refractive index of the inorganic particles.

2. The reflective member according to claim 1, wherein the reflective layer has a porosity of 15-43%.

3. The reflective member according to claim 1, wherein the inorganic particles are partially combined with each other by calcination.

4. The reflective member according to claim 1, wherein the inorganic material comprises at least one of alumina, yttria, zirconia, and titania.

* * * * *